United States Patent
Hall

(10) Patent No.: US 10,132,849 B1
(45) Date of Patent: Nov. 20, 2018

(54) TWO WIRE POWER AND SERIAL COMMUNICATION

(71) Applicant: Simmonds Precision Products, Inc., Vergennes, VT (US)

(72) Inventor: Robbie W. Hall, Charlotte, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 31 days.

(21) Appl. No.: 15/600,059

(22) Filed: May 19, 2017

(51) Int. Cl.
*G01R 31/00* (2006.01)
*H02M 7/04* (2006.01)
*G11C 5/14* (2006.01)
*G11C 7/06* (2006.01)
*H01F 19/04* (2006.01)

(52) U.S. Cl.
CPC ............ *G01R 31/005* (2013.01); *G11C 5/147* (2013.01); *G11C 7/06* (2013.01); *H01F 19/04* (2013.01); *H02M 7/04* (2013.01)

(58) Field of Classification Search
CPC ........ G01R 31/005; G11C 5/147; G11C 7/06; H01F 19/04; H02M 7/04
See application file for complete search history.

(56) References Cited

U.S. PATENT DOCUMENTS

| | | | |
|---|---|---|---|
| 3,917,916 A | 11/1975 | Ghosh et al. | |
| 5,986,539 A | 11/1999 | Johnsson et al. | |
| 6,348,876 B1 | 2/2002 | Wei et al. | |
| 2007/0112480 A1 | 5/2007 | Smith et al. | |
| 2015/0229224 A1* | 8/2015 | Werner | H02M 3/33515 363/21.13 |

OTHER PUBLICATIONS

European Search Report for EP Application No. 18171802.4, dated Jul. 17, 2018, 8 pages.

* cited by examiner

*Primary Examiner* — Curtis Odom
(74) *Attorney, Agent, or Firm* — Kinney & Lange, P.A.

(57) ABSTRACT

A power and data communication system includes an inboard computer, an outboard computer, and first and second wires. The first and second wires connect a first isolation transformer of the inboard computer to a second isolation transformer of the outboard computer. The inboard computer drives a driven voltage through the first isolation transformer. The outboard computer is configured to receive the driven voltage through the second isolation transformer to power the outboard computer. The outboard computer incudes a load that is selectively connected across the second isolation transformer to transmit data to the inboard computer. The inboard computer receives the data through the first isolation transformer.

19 Claims, 4 Drawing Sheets

TWO WIRE POWER AND SERIAL COMMUNICATION

BACKGROUND

The present disclosure relates generally to signal communication, and in particular to a system and method for providing two-wire power and serial communication.

In aircraft systems, many avionics systems utilize computers that are located within the fuselage of the aircraft. These computers may interface with active sensors or remote data concentrators (RDCs) located either internal or external to the fuselage. Two wire serial communication is often used and additional wiring is used for power, resulting in at least four wires. The aircraft power needs to be conditioned, which often requires a switched mode power supply. The extra wires, especially over long spans, add undesirable weight and also introduce extra conductors susceptible to electromagnetic interference, lightning strikes, and faults, such as hot shorts. It is desirable to reduce the number of conductors that must be run between system computers and the systems with which they interface, such as RDCs and active sensors.

SUMMARY

A method of communicating power and data between an inboard computer and an outboard computer includes driving, by the inboard computer, a power signal through a first isolation transformer; receiving, by the outboard computer, the power signal through a second isolation transformer; powering a processor of the outboard computer using the received power signal; selectively connecting, by the processor of the outboard computer, a load connected across the second isolation transformer to transmit data to the inboard computer; and monitoring, by the inboard computer, a current through the first isolation transformer to receive the data from the outboard computer.

A power and data communication system includes an inboard computer, an outboard computer, and first and second wires. The first and second wires connect a first isolation transformer of the inboard computer to a second isolation transformer of the outboard computer. The inboard computer drives a driven voltage through the first isolation transformer. The outboard computer is configured to receive the driven voltage through the second isolation transformer to power the outboard computer. The outboard computer incudes a load that is selectively connected across the second isolation transformer to transmit data to the inboard computer. The inboard computer receives the data through the first isolation transformer.

An electronic system includes an isolation transformer, a processor, a load and a switch. The isolation transformer is connected to first and second communication wires. The switch is connected in series with the load and configured to selectively connect the load across the isolation transformer. The electronic system receives power through the isolation transformer from the first and second communication wires, and the processor is configured to control the switch to selectively connect the load across the isolation transformer to transmit data on the first and second communication wires.

DETAILED DESCRIPTION

A serial communication and power protocol is disclosed herein that allows transmission of both serial data and power over a common two wires. An inboard computer and outboard computer are connected to the common two wires through respective isolation transformers. The inboard computer sends high frequency alternating current (AC) power to the outboard computer through the two wires via the first isolation transformer. The outboard computer sends data back to the inboard computer over the same two wires via the second isolation transformer. The outboard computer controls data transmission by selectively connecting a load across the second isolation transformer.

Figure 1:
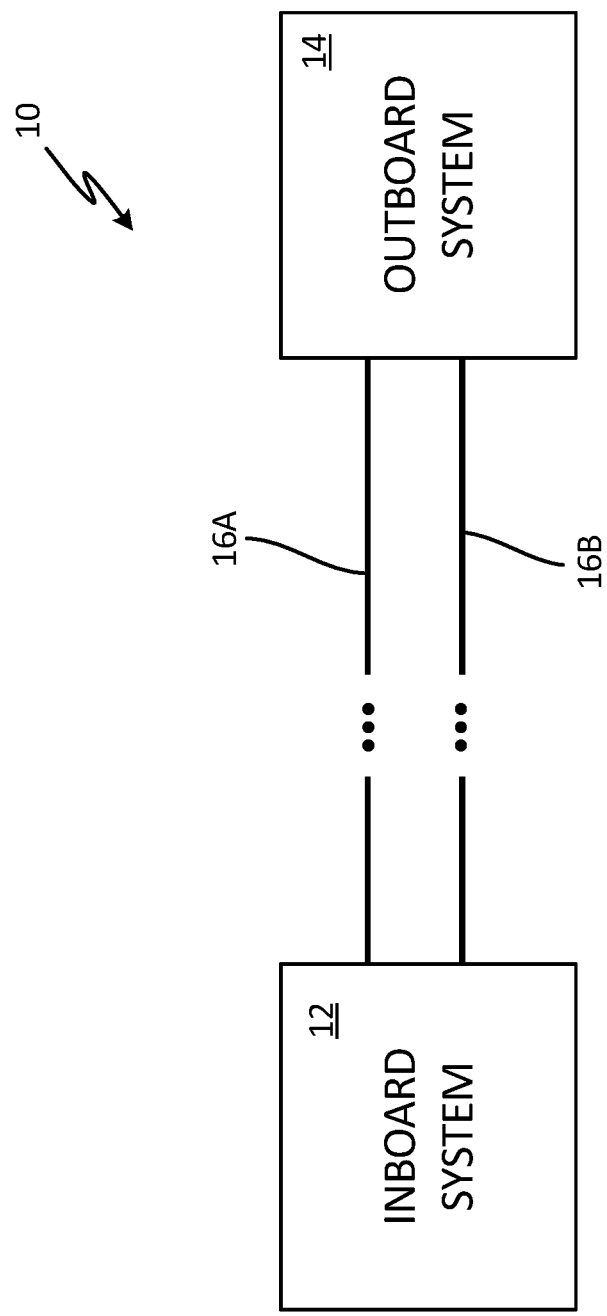
FIG. 1 is a block diagram illustrating a communication system that utilizes a two-wire power and serial communication scheme.

FIG. 1 is a block diagram illustrating communication system 10 that utilizes a two-wire power and serial communication scheme. System 10 includes inboard system 12, outboard system 14, and communication wires 16a and 16b. Inboard system 12 may be any system that communicates with, and provides power for, remote systems, such as aircraft computer systems internal to the fuselage, for example. Outboard system 14 is any computer system that receives power from inboard system 12 and provides data communication to inboard system 12. Outboard system may be a remote data concentrator (RDC) or active sensor, for example. Wires 16a and 16b may be any type of conductor capable of providing electrical power to outboard computer 14 and providing electrical data to inboard computer 12.

Figure 2:
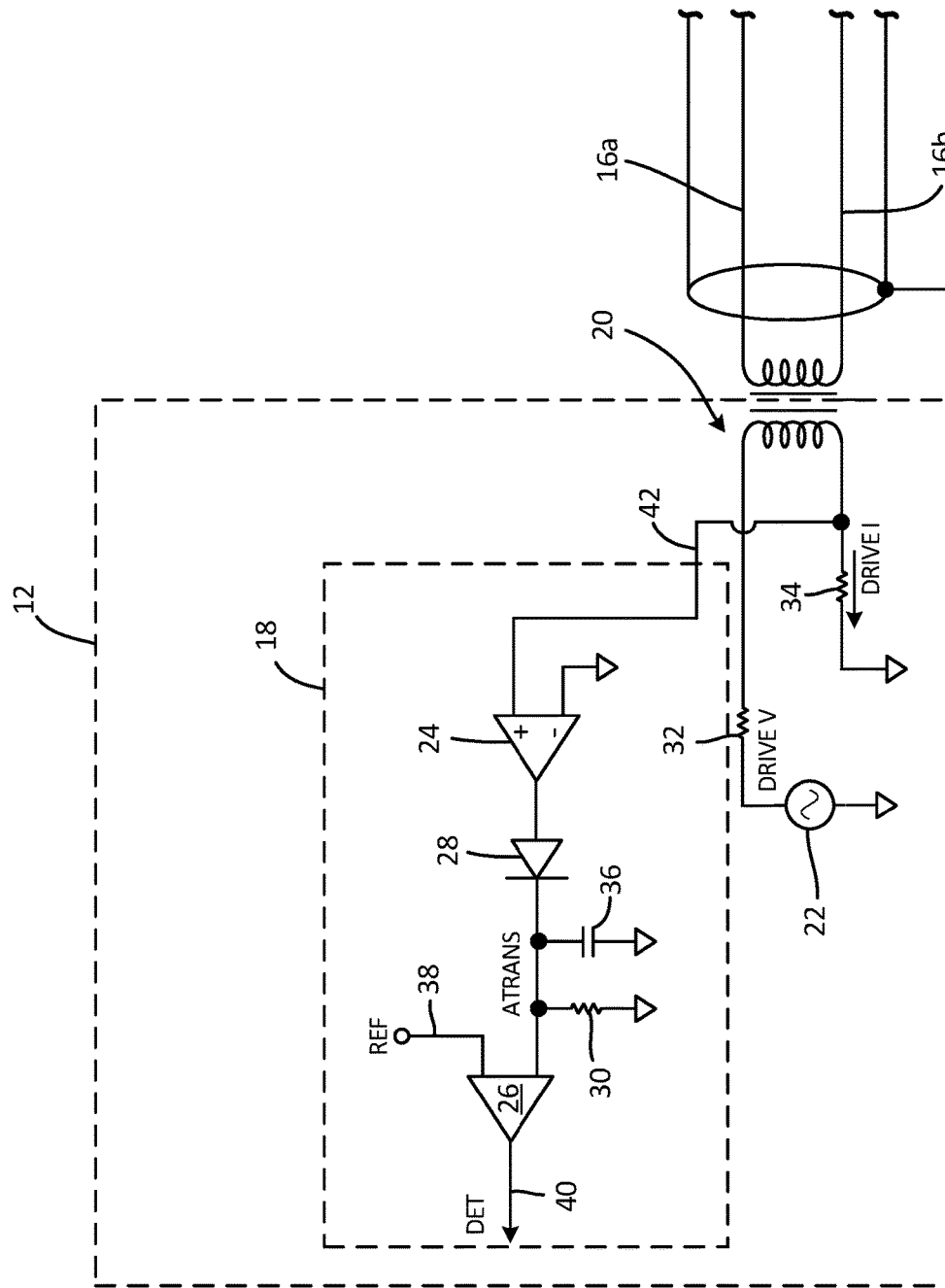
FIG. 2 is a circuit diagram illustrating an inboard device configured to utilize a two-wire power and serial communication scheme.

FIG. 2 is a circuit diagram illustrating inboard system 12. Inboard system 12 includes current transmission detector circuit 18, isolation transformer 20, drive source 22, amplifier 24, comparator 26, diode 28, resistors 30, 32 and 34, capacitor 36, reference 38, detection line 40 and current sense line 42. Inboard system 12 may also include other electronic components not shown such as microprocessors, data memory units, and any other computer system components, for example.

Figure 3:
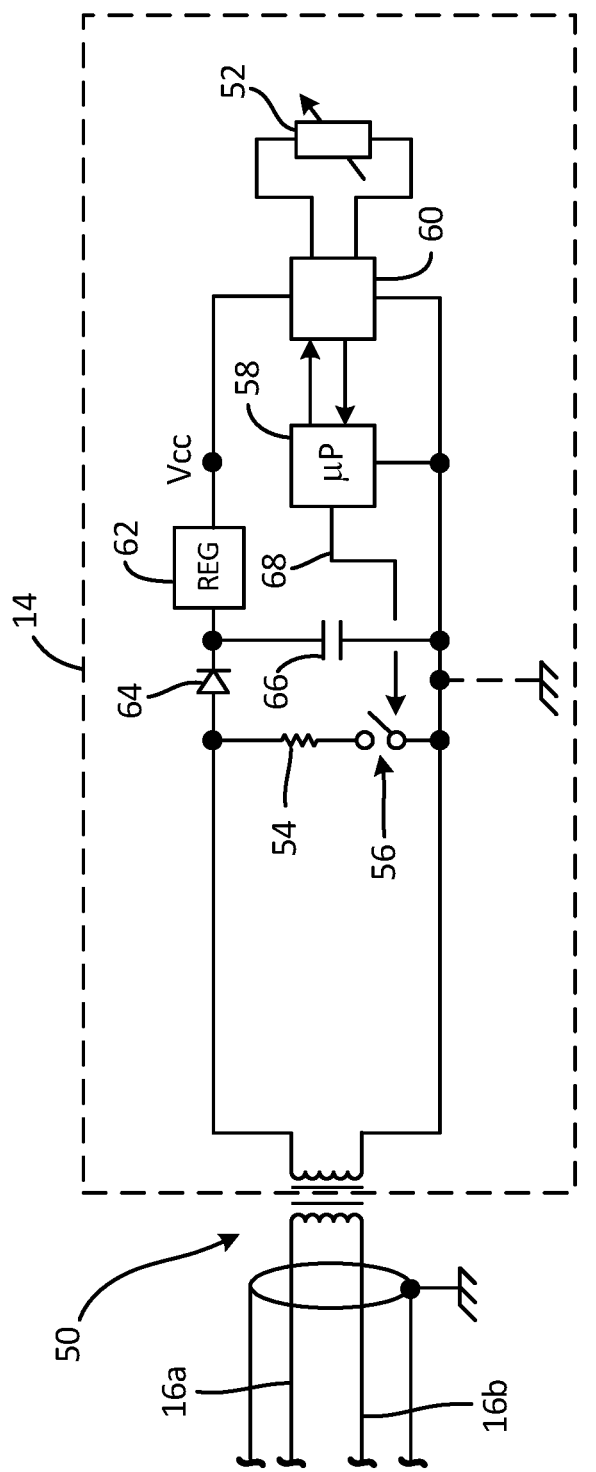
FIG. 3 is a circuit diagram illustrating an outboard device configured to utilize a two-wire power and serial communication scheme.

With continued reference to FIG. 2, FIG. 3 is a circuit diagram illustrating outboard system 14. Outboard system 14 includes isolation transformer 50, sensing element 52, load 54, switch 56, processor 58, signal conditioning circuit 60, regulator 62, diode 64, capacitor 66 and switch control line 68. While illustrated as an active sensor, outboard system 14 may be any computer system configured to receive power through isolation transformer 50 and transmit serial data communication through isolation transformer 50.

Alternating current (AC) power is provided to outboard system 14 from inboard system 12 using drive source 22. Drive source 22 may be a high frequency source, such as a one megahertz (MHz) source, generated by inboard system 12. For example, inboard system 12 may be provided with 28 volt (V) direct current (DC) power from an aircraft power bus. Inboard system 12 may invert and condition the 28V DC power to provide the high frequency AC power from drive source 22. The 1 MHz signal is provided to a primary winding of isolation transformer 20 through resistor 32, which transmits the 1 MHz signal onto communication wires 16a and 16b via the secondary winding of isolation transformer 20. It is advantageous to use a high frequency source in order to minimize the required size of isolations transformers 20 and 50 and to minimize the amount of filtering needed for any active electronics of system 10.

The 1 MHz power signal is received by outboard system 14 through isolation transformer 50 and conditioned by outboard system 14. The 1 MHz AC signal is rectified by diode 64. The rectified signal is utilized to charge capacitor 66 which provides hold-up power, for example, for regulator 62. Regulator 62 is configured to condition the hold-up power to provide a DC power ($V_{CC}$) for use by the electronic components of outboard system 14. $V_{CC}$ may be any power sufficient to power processor 58, signal conditioning circuit 60, and any other electronic components of outboard system 14. Regulator 62 may be any circuit configured to condition the power from inboard system 12 to meet the needs of the electronic components of outboard system 14.

Signal conditioning circuit 60 may be an interface circuit configured to provide an excitation signal to sensing element 52, and receive a signal response from sensing element 52 for processor 58. Sensing element 52 may be configured to provide a signal response that is indicative of characteristics of the environment. Sensing element 52 may be a capacitive element, inductive element, resistive element, or any other sensing device configured to provide an electrical response indicative of the environment.

Processor 58 may be configured to control signal conditioning circuit 60 to excite sensing element 52, and receive data from sensing element 52 through signal conditioning circuit 60. Processor 58 may include an analog-to-digital conversion circuit, for example, or outboard system 14 may include an analog-to-digital conversion circuit separate from processor 58 to convert the analog signal from sensing element 52 into a digital value. Data provided to inboard system 12 from outboard system 14 may be the digital value indicative of the output of sensing element 52, or may be any other digital value calculated or determined by processor 58.

Processor 58 generates a serial data string for output to wires 16a and 16b. The serial data string, for example, may be a series of bits (e.g., "ones" and "zeros") transmitted consecutively and representative of the digital value from processor 58. Processor 58 controls switch 56 using control line 68 to selectively connect and disconnect load 54 across isolation transformer 50. For example, processor 58 may connect load 54 across isolation transformer each time processor 58 wants to send a logic "one" as a data bit, and may disconnect load 54 each time processor 58 wants to send a logic "zero" as a data bit. Processor 58 is any electronic circuit capable of receiving an analog signal from sensing element 52 and controlling switch 56 to transmit a serial data string. For example, processor 58 may be a microcontroller, microprocessor, field programmable gate array (FPGA), or any other digital logic circuit capable of controlling switch 56 to transmit data. Switch 56 is any device capable of selectively connecting load 54 across isolation transformer 50 based on control signal 68 such as a metal-oxide-semiconductor field-effect transistor (MOSFET), insulated gate bipolar transistor (IGBT) or any other electrical or mechanical switch device.

Figure 4:
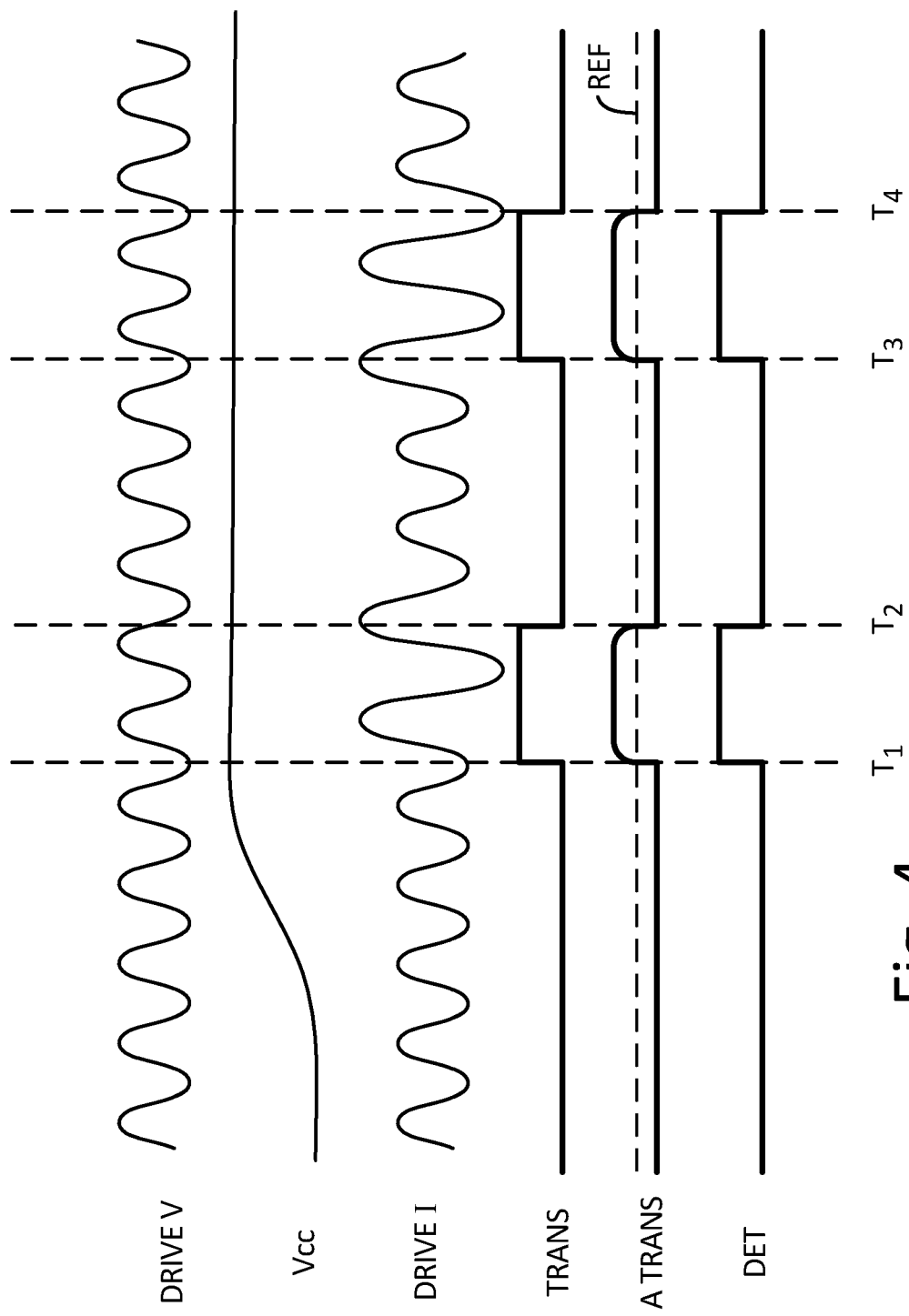
FIG. 4 is a chart illustrating a plurality of signals present in a two-wire power and serial communication scheme.

With continued reference to FIGS. 2 and 3, FIG. 4 is a signal diagram illustrating voltages and currents within system 10. Drive V, as illustrated in FIG. 2, is the voltage driven by drive source 22 and provided to isolation transformer 20. Drive I, as illustrated in FIG. 2, is a current that flows through resistor 34 from the primary winding of isolation transformer 20 to ground. $V_{CC}$, as illustrated in FIG. 3, is the conditioned voltage from regulator 62. TRANS, as illustrated in FIG. 3 is the signal on control line 68 for controlling switch 56. ATRANS is the signal at the output of diode 28 fed to comparator 26, and DET is the signal on detection line 40, both illustrated in FIG. 2.

Shortly prior to time T1, power has been provided for a sufficient time such that regulator 62 is able to provide $V_{CC}$ to the electronic components of outboard system 14. At this time (T1), data may be transmitted to inboard system 12 from outboard system 14. At times T1 and T3, processor 58 controls switch 56 to connect load 54 across isolation transformer 50 in order to transmit a logic "one" data bit. For example, processor 58 outputs TRANS as a high value on control line 68 to close switch 56 and connect load 54 across isolation transformer 50. As seen in FIG. 4, when load 54 is connected across isolation transformer 50, Drive I increases in amplitude. This increase is detected by current transmission detector circuit 18. At times T2 and T4, processor 58 controls switch 56 to disconnect load 54 from across isolation transformer 50 in order to transmit a logic "zero" data bit.

Drive I is sensed and amplified by amplifier 24, rectified by diode 28, and conditioned and filtered by resistor 30 and capacitor 36 to produce signal ATRANS. ATRANS is a "rough" signal indicative of the digital serial value received from outboard computer 14. Comparator 26 is utilized to compare the ATRANS signal to reference 38. Reference 38 is illustrated in FIG. 4 with a dotted line as compared to ATRANS. When ATRANS is greater than reference 38, comparator 26 outputs a voltage indicative of a logic "one" value on detection line 40 as illustrated by DET in FIG. 4. When the ATRANS signal is less than reference 38, comparator 26 outputs a voltage indicative of a logic "zero" value on detection line 40. This way, detection line 40 may be provided to a microprocessor or other electronic circuit of inboard computer 12 to consume the data provide by outboard system 14.

By transmitting power and data this way, inboard system 12 and outboard system 14 may be galvanically isolated from transmission wires 16a and 16b. If lightning strikes the wires, or there is a fault, such as a hot short of the wires, the active sensor or remote data concentrator, for example, is isolated by isolation transformer 50. These active sensors or remote data concentrators may be located in flammable zones, such as fuel tanks, for example, in which it advantageous to isolate the wires from the sensor. Further, due to the galvanic isolation, the outboard electronics can be tied to chassis, because any lightning strikes to the outboard device will not transfer to the communication wires.

Discussion of Possible Embodiments

The following are non-exclusive descriptions of possible embodiments of the present invention.

A method of communicating power and data between an inboard computer and an outboard computer includes driving, by the inboard computer, a power signal through a first isolation transformer; receiving, by the outboard computer, the power signal through a second isolation transformer; powering a processor of the outboard computer using the received power signal; selectively connecting, by the processor of the outboard computer, a load connected across the second isolation transformer to transmit data to the inboard computer; and monitoring, by the inboard computer, a current through the first isolation transformer to receive the data from the outboard computer.

The method of the preceding paragraph can optionally include, additionally and/or alternatively, any one or more of the following features, configurations and/or additional components:

A further embodiment of the foregoing method, wherein the power signal is a high-frequency alternating current signal.

A further embodiment of any of the foregoing methods, wherein the power signal is a one megahertz signal.

A further embodiment of any of the foregoing methods, wherein powering a processor of the outboard computer using the received power signal includes rectifying the high-frequency alternating current signal to generate a direct current signal; and conditioning the direct current signal to provide a conditioned direct current signal to power the processor.

A further embodiment of any of the foregoing methods, wherein selectively connecting, by the processor of the outboard computer, the load connected across the second isolation transformer to transmit the data to the inboard computer includes controlling, by the processor, a switch connected in series with the load to selectively connect the load across the second isolation transformer.

A further embodiment of any of the foregoing methods, wherein monitoring, by the inboard computer, the current through the first isolation transformer to receive the data from the outboard computer includes amplifying the current through a sense resistor connected in series with the first isolation transformer.

A further embodiment of any of the foregoing methods, wherein monitoring, by the inboard computer, the current through the first isolation transformer to receive the data from the outboard computer further includes comparing the amplified current to a reference value to generate a detected data bit signal.

A power and data communication system includes an inboard computer, an outboard computer, and first and second wires. The first and second wires connect a first isolation transformer of the inboard computer to a second isolation transformer of the outboard computer. The inboard computer drives a driven voltage through the first isolation transformer. The outboard computer is configured to receive the driven voltage through the second isolation transformer to power the outboard computer. The outboard computer incudes a load that is selectively connected across the second isolation transformer to transmit data to the inboard computer. The inboard computer receives the data through the first isolation transformer.

The system of the preceding paragraph can optionally include, additionally and/or alternatively, any one or more of the following features, configurations and/or additional components:

A further embodiment of the foregoing system, wherein the power signal is a high-frequency alternating current signal.

A further embodiment of any of the foregoing systems, wherein the power signal is a one megahertz signal.

A further embodiment of any of the foregoing systems, wherein the outboard computer includes a rectifier to rectifier the high-frequency alternating current signal to generate a direct current signal, and wherein the outboard computer further includes a regulator circuit configured to condition the direct current signal to provide a conditioned direct current signal to power a processor.

A further embodiment of any of the foregoing systems, wherein the outboard computer includes a processor configured to control a switch to selectively connect the load across the second isolation transformer.

A further embodiment of any of the foregoing systems, wherein the inboard computer includes a current detector circuit configured to determine a drive current through a sense resistor, wherein the sense resistor is connected in series with the first isolation transformer.

A further embodiment of any of the foregoing systems, wherein the current detector circuit is configured to compare the drive current to a threshold value, and wherein the current detector circuit outputs a bit detection signal if the drive current is greater than the threshold value.

An electronic system includes an isolation transformer, a processor, a load and a switch. The isolation transformer is connected to first and second communication wires. The switch is connected in series with the load and configured to selectively connect the load across the isolation transformer. The electronic system receives power through the isolation transformer from the first and second communication wires, and the processor is configured to control the switch to selectively connect the load across the isolation transformer to transmit data on the first and second communication wires.

The system of the preceding paragraph can optionally include, additionally and/or alternatively, any one or more of the following features, configurations and/or additional components:

A further embodiment of the foregoing system, wherein the power is high-frequency alternating current power.

A further embodiment of any of the foregoing systems, wherein the electronic system is an active sensor.

A further embodiment of any of the foregoing systems, wherein the processor is configured to transmit a sensed value of the active sensor by controlling the switch.

A further embodiment of any of the foregoing systems, wherein the sensed value is transmitted as serial data on the first and second communication wires.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of communicating power and data between an inboard computer and an outboard computer, the method comprising:
   driving, by the inboard computer, a power signal through a first isolation transformer;
   receiving, by the outboard computer, the power signal through a second isolation transformer;
   powering a processor of the outboard computer using the received power signal;
   selectively connecting, by the processor of the outboard computer, a load connected across the second isolation transformer to transmit data to the inboard computer; and
   monitoring, by the inboard computer, a current through the first isolation transformer to receive the data from the outboard computer.

2. The method of claim 1, wherein the power signal is a high-frequency alternating current signal.

3. The method of claim 2, wherein the power signal is a one megahertz signal.

4. The method of claim 2, wherein powering a processor of the outboard computer using the received power signal comprises:
rectifying the high-frequency alternating current signal to generate a direct current signal; and
conditioning the direct current signal to provide a conditioned direct current signal to power the processor.

5. The method of claim 1, wherein selectively connecting, by the processor of the outboard computer, the load connected across the second isolation transformer to transmit the data to the inboard computer comprises:
controlling, by the processor, a switch connected in series with the load to selectively connect the load across the second isolation transformer.

6. The method of claim 1, wherein monitoring, by the inboard computer, the current through the first isolation transformer to receive the data from the outboard computer comprises amplifying the current through a sense resistor connected in series with the first isolation transformer.

7. The method of claim 6, wherein monitoring, by the inboard computer, the current through the first isolation transformer to receive the data from the outboard computer further comprises comparing the amplified current to a reference value to generate a detected data bit signal.

8. A power and data communication system comprising:
an inboard computer system that includes a first isolation transformer;
an outboard computer system that includes a second isolation transformer;
first and second wires connecting the first and second isolation transformers;
wherein the inboard computer drives a driven voltage through the first isolation transformer, and wherein the outboard computer is configured to receive the driven voltage through the second isolation transformer to power the outboard computer; and
wherein the outboard computer incudes a load that is selectively connected across the second isolation transformer to transmit data to the inboard computer, wherein the inboard computer receives the data through the first isolation transformer.

9. The system of claim 8, wherein the power signal is a high-frequency alternating current signal.

10. The system of claim 9, wherein the power signal is a one megahertz signal.

11. The system of claim 8, wherein the outboard computer includes a rectifier to rectifier the high-frequency alternating current signal to generate a direct current signal, and wherein the outboard computer further includes a regulator circuit configured to condition the direct current signal to provide a conditioned direct current signal to power a processor.

12. The system of claim 8, wherein the outboard computer includes a processor configured to control a switch to selectively connect the load across the second isolation transformer.

13. The system of claim 8, wherein the inboard computer includes a current detector circuit configured to determine a drive current through a sense resistor, wherein the sense resistor is connected in series with the first isolation transformer.

14. The system of claim 13, wherein the current detector circuit is configured to compare the drive current to a threshold value, and wherein the current detector circuit outputs a bit detection signal if the drive current is greater than the threshold value.

15. An electronic system comprising:
an isolation transformer connected to first and second communication wires;
a processor;
a load; and
a switch connected in series with the load, wherein the switch is configured to selectively connect the load across the isolation transformer;
wherein the electronic system receives power through the isolation transformer from the first and second communication wires, and wherein the processor is configured to control the switch to selectively connect the load across the isolation transformer to transmit data on the first and second communication wires.

16. The electronic system of claim 15, wherein the power is high-frequency alternating current power.

17. The electronic system of claim 15, wherein the electronic system is an active sensor.

18. The electronic system of claim 17, wherein the processor is configured to transmit a sensed value of the active sensor by controlling the switch.

19. The electronic system of claim 18, wherein the sensed value is transmitted as serial data on the first and second communication wires.

* * * * *